(12) United States Patent
Sun et al.

(10) Patent No.: US 9,698,369 B2
(45) Date of Patent: Jul. 4, 2017

(54) DISPLAY PANEL AND MANUFACTURING METHOD THEREOF AND DISPLAY DEVICE

(71) Applicant: BOE TECHNOLOGY GROUP CO., LTD., Beijing (CN)

(72) Inventors: Zhongyuan Sun, Beijing (CN); Kaihong Ma, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 59 days.

(21) Appl. No.: 14/436,490

(22) PCT Filed: Nov. 6, 2014

(86) PCT No.: PCT/CN2014/090512
§ 371 (c)(1),
(2) Date: Apr. 17, 2015

(87) PCT Pub. No.: WO2015/127798
PCT Pub. Date: Sep. 3, 2015

(65) Prior Publication Data
US 2016/0276618 A1 Sep. 22, 2016

(30) Foreign Application Priority Data
Feb. 28, 2014 (CN) .......................... 2014 1 0073649

(51) Int. Cl.
*H01L 51/00* (2006.01)
*H01L 51/52* (2006.01)
*H01L 27/32* (2006.01)

(52) U.S. Cl.
CPC ........ *H01L 51/525* (2013.01); *H01L 27/3246* (2013.01); *H01L 51/0029* (2013.01);
(Continued)

(58) Field of Classification Search
CPC .......... H01L 51/52; H01L 51/00; H01L 27/32
(Continued)

(56) References Cited

U.S. PATENT DOCUMENTS 6,992,439 B2 * 1/2006 Yamazaki et al. ............ 313/512
7,883,386 B2 2/2011 Ho et al.
(Continued)

FOREIGN PATENT DOCUMENTS

CN 1414643 A 4/2003
CN 1499652 A 5/2004
(Continued)

OTHER PUBLICATIONS

1st office application for Chinese application No. 201410073649.6 dated Feb. 2, 2016.
(Continued)

*Primary Examiner* — Sheng Zhu
(74) *Attorney, Agent, or Firm* — Nath, Goldberg & Meyer; Joshua B. Goldberg; Tanya E. Harkins

(57) ABSTRACT

The present invention discloses a display panel, a manufacturing method thereof and a display device. The display panel comprises a first substrate divided into a display area and a non-display area surrounding the display area, a plurality of sub-pixel units are provided on a part of the first substrate corresponding to the display area, a photo spacer is provided between two adjacent sub-pixel units and comprises a base and a plurality of protruding structures provided on the base, and the base is made from material including In+ ions which are replaceable with H+ ions. For the display panel, the photo spacers are manufactured using Haze phenomenon generated by contacting ITO thin film with ionized $H_2$, so as to provide support between the encapsulation substrate and the evaporated substrate encapsulated by frit seal and effectively protect the OLED devices (Continued)

from damage, and therefore, the display panel has better performance.

18 Claims, 1 Drawing Sheet

(52) U.S. Cl.
CPC ...... *H01L 51/5246* (2013.01); *H01L 51/5253* (2013.01); *H01L 2227/323* (2013.01); *H01L 2251/308* (2013.01)

(58) Field of Classification Search
USPC .............................. 257/40, 59; 313/506, 512
See application file for complete search history.

(56) References Cited

U.S. PATENT DOCUMENTS

| | | | | |
|---|---|---|---|---|
| 2001/0026121 | A1* | 10/2001 | Khan | G02F 1/13394 313/483 |
| 2005/0184969 | A1* | 8/2005 | Dunn et al. | 345/173 |
| 2010/0171106 | A1* | 7/2010 | Jung et al. | 257/40 |
| 2010/0207520 | A1* | 8/2010 | Zhu et al. | 313/506 |
| 2014/0027729 | A1 | 1/2014 | So et al. | |
| 2014/0284575 | A1* | 9/2014 | Sugisawa et al. | 257/40 |

FOREIGN PATENT DOCUMENTS

| | | |
|---|---|---|
| CN | 101097945 A | 1/2008 |
| CN | 102013442 A | 4/2011 |
| CN | 103081028 A | 5/2013 |
| CN | 103325859 A | 9/2013 |
| CN | 103337478 A | 10/2013 |
| CN | 103872089 A | 6/2014 |
| CN | 203839419 U | 9/2014 |
| KR | 20070011008 A | 1/2007 |
| TW | 275052 B | 3/2007 |

OTHER PUBLICATIONS

International Search Report dated Nov. 6, 2014 corresponding to application No. PCT/CN2014/090512.
English Translation of the Written Opinion of the International Searching Authority dated Jan. 21, 2015 corresponding to application No. PCT/CN2014/090512.

* cited by examiner

DISPLAY PANEL AND MANUFACTURING METHOD THEREOF AND DISPLAY DEVICE

This is a National Phase Application filed under 35 U.S.C. 371 as a national stage of PCT/CN2014/090512, filed Nov. 6, 2014, an application claiming the benefit of Chinese Application No. 201410073649.6, filed Feb. 28, 2014, the content of each of which is hereby incorporated by reference in its entirety.

FIELD OF THE INVENTION

The present invention relates to the field of display technology, and particularly relates to a display panel, a manufacturing method thereof and a display device.

BACKGROUND OF THE INVENTION

In recent years, OLEDs (Organic Light-emitting Diodes) develop rapidly, and have already technically become most possible to replace LCDs (Liquid Crystal Displays). Generally, an OLED device at least includes an anode, a cathode and an organic light-emitting layer located between the anode and the cathode. The organic light-emitting layer and electrodes in the OLED device are easily eroded by water and oxygen, so that the service life of the OLED device is greatly reduced. The encapsulation technology for the OLED device is one of the cores of the research at the present stage.

Currently, an encapsulation method of the OLED device includes attachment of getter and coating of ultraviolet (UV) adhesives, face seal, frit seal encapsulation, thin film encapsulation and the like. The frit seal encapsulation is an encapsulation method as follows: adding glass frit such as $SiO_2$, $Al_2O_3$ and the like to other raw materials to form paste, coating the paste on an encapsulation substrate; then aligning the encapsulation substrate and an evaporated substrate with each other; and finally, sintering the frit seal by means of laser.

In the frit seal encapsulation process, when the encapsulation substrate and the evaporated substrate are aligned with each other, as shown in FIG. 1, because frit seal 5 is coated on the encapsulation substrate 4, the evaporated substrate 1 can be tightly adhered to the frit seal 5 under a certain pressure. The pressure may cause small deformation to the encapsulation substrate, and specifically, may cause the encapsulation substrate 4 to be bent, as shown in FIG. 1. However, because the thickness of the frit seal 5 is only a few microns, the encapsulation substrate 4 is pressed on the OLED device 2 due to the deformation so as to result in damage to the OLED device, thus influencing the performance of the display panel.

In order to prevent the damage to the OLED device caused by bending of the encapsulation substrate 4, A solution adopted currently is that as shown in FIG. 2, a photo spacer 3 (PS) with certain thickness is formed on the evaporated substrate 1. When the encapsulation substrate 4 is deformed (bent) due to pressure, the photo spacer 3 supports the encapsulation substrate 4 to keep the distance between the encapsulation substrate 4 and the evaporated substrate 1, thereby protecting the OLED device 2 from being damaged. At present, the photo spacer 3 is generally formed by photoetching, namely, the photo spacer is formed by a photo line formed by a series of photoetching equipments. For example, a layer of photoresist is coated on the evaporated substrate 1 by using a coating machine, then is exposed by an exposure machine, next is developed by using a developing machine and subsequently is cured by using a curing machine so that the photo spacer with certain thickness and shape is finally formed.

Since forming photo spacer by photoetching needs a lot of equipments, and particularly the exposure machine is always a bottleneck in the photoetching process, the cost is relatively high. Therefore, when a photo line is specially provided for forming a deformation-resistant photo spacer, the occupied space is large, the manufacturing cost is greatly increased, and thus the cost of the display panel and the display device is correspondingly increased. Moreover, the photoetching method is complicated in process.

SUMMARY OF THE INVENTION

In view of the disadvantages in the prior art, the present invention provides a display panel, a manufacturing method thereof and a display device, in which the method for forming the photo spacer in the display panel is simpler and the manufacturing cost is lower.

To solve the above technical problem, according to one aspect of the present invention, there is provided a display panel, including a first substrate, which is divided into a display area and a non-display area surrounding the display area, wherein a plurality of sub-pixel units are provided on a part of the first substrate corresponding to the display area, a photo spacer is provided between two adjacent sub-pixel units, and includes a base and a plurality of protruding structures provided on the base, and the base is made from a material including In+ ions which are replaceable with H+ ions.

Preferably, each sub-pixel unit includes an OLED device, and thickness of the photo spacer is greater than that of the OLED device.

Preferably, the material of the base is indium tin oxide or indium zinc oxide.

Preferably, the base is in a shape of circular truncated cone, and the protruding structures are semispherical or semi-ellipsoidal.

Preferably, ratio of thickness of the base to thickness of each protruding structure ranges from 1:2 to 1:3, and the thickness of the base is in the range of 1,000 Å to 4,000 Å

Preferably, a protective layer is provided on the OLED device, wherein the protective layer covers all OLED devices and extends to gap areas formed between adjacent OLED devices, and the photo spacers are provided on the protective layer and correspond to the gap areas.

Preferably, material of the protective layer is silicon nitride.

Preferably, thickness of the protective layer is in the range of 4,000 Å to 10,000 Å.

Preferably, the display panel further includes a second substrate, and an encapsulation frame corresponding to periphery of the non-display area is provided between the first substrate and the second substrate and is made from frit seal.

According to another aspect of the present invention, there is provided a display device including the above-mentioned display panel.

According to still another aspect of the present invention, a method for fabricating a display panel includes steps of:

S1: forming a plurality of sub-pixel units on a part of a first substrate corresponding to a display area of the first substrate; and S2: forming a photo spacer between two adjacent sub-pixel units, wherein step S2 includes steps of:

S21: forming bases on the first substrate; and

S22: based on each base, growing a plurality of protruding structures on a top surface of the base.

Preferably, step S21 includes a step of: forming the bases on the first substrate in a chamber of a first film-forming equipment by means of sputtering by using a material including In+ ions which are replaceable with H+ ions. Here, the material including In+ ions which are replaceable with H+ ions may be indium tin oxide or indium zinc oxide.

Preferably, step S22 includes steps of: placing the first substrate with the bases formed thereon into a chamber of a second film-forming equipment; and introducing $H_2$ into the chamber of the second film-forming equipment, ionizing $H_2$, and replacing, with H+ ions generated by the ionizing, In+ ions in the material forming the base and including In+ ions which are replaceable with H+ ions, so that the plurality of protruding structures are grown on the top surface of the base.

Further preferably, volume flow rate for introducing $H_2$ is in the range of 500 sccm to 2,000 sccm, and time for introducing $H_2$ is in the range of 10 s to 200 s; pressure intensity in the chamber of the second film-forming equipment is in the range of 500 Pa to 3,000 Pa, and temperature therein is in the range of 150° C. to 400° C.

Preferably, the first film-forming equipment is a sputter, and the second film-forming equipment is a plasma enhanced chemical vapor deposition equipment.

Preferably, prior to step S2, the manufacturing method further includes a step of: forming a protective layer on the sub-pixel units, wherein the protective layer covers all sub-pixel units and extends to gap areas formed between adjacent sub-pixel units and the bases are formed on the protective layer and correspond to the gap areas.

Preferably, the protective layer is formed using silicon nitride by deposition in a deposition equipment.

The present invention achieves the beneficial effects as follows: in the display panel provided by the present invention, the photo spacers are manufactured by using Haze phenomenon generated by contacting a thin film formed by the material (for example, ITO) containing the In+ ions which are replaceable with the H+ ions with the ionized $H_2$, the photo spacers can support the encapsulation substrate and the evaporated substrate which are encapsulated by frit seal so as to effectively protect the OLED devices from being damaged, and therefore, the performance of the display panel is better. Moreover, the photo spacers can be manufactured by using only a sputter and a plasma enhanced chemical vapor deposition equipment. Compared with the photo line for manufacturing the photo spacers in the prior art, the equipment cost is greatly reduced and the occupied space is narrowed, the yield is increased, and the manufacturing cost is reduced in the present invention.

Correspondingly, the display device has a good display effect and is low in cost because of the above-mentioned display panel.

DETAILED DESCRIPTION OF THE EMBODIMENTS

To make a person skilled in the art better understand the technical solution of the present invention, a display panel and a manufacturing method thereof as well as a display device are further described in details below in conjunction with the accompanying drawings and the specific embodiments.

In one aspect of the present invention, there is provided a display panel including a first substrate, which is divided into a display area and a non-display area surrounding the display area, wherein a plurality of sub-pixel units are provided on a part of the first substrate corresponding to the display area; a photo spacer is provided between two adjacent sub-pixel units, and the photo spacer includes a base and a plurality of protruding structures provided on the base, and the base is made from a material including In+ ions which are replaceable with H+ ions.

In another aspect of the present invention, there is provided a display device including the above-mentioned display panel.

In still another aspect of the present invention, there is provided a method for fabricating a display panel, including steps of:

S1: forming a plurality of sub-pixel units on a part of the first substrate corresponding to a display area of the first substrate; and S2: forming a photo spacer between two adjacent sub-pixel units, wherein step S2 includes steps of:

S21: forming bases on the first substrate; and

S22: based on each base, growing a plurality of protruding structures on a top surface of the base.

Embodiment 1

The embodiment provides a display panel, including a first substrate, which is divided into a display area and a non-display area surrounding the display area, a plurality of sub-pixel units are provided on a part of the first substrate corresponding to the display area, a photo spacer is provided between two adjacent sub-pixel units, wherein the photo spacer includes a base and a plurality of protruding structures provided on the base, and the base is made from a material including In+ ions which are replaceable with H+ ions. Each sub-pixel unit includes an OLED device, and a thickness of the photo spacer is greater than that of the OLED device.

The display panel further includes a second substrate, an encapsulation frame corresponding to the periphery of the non-display area is provided between the first substrate and the second substrate and is made from frit seal, and the photo spacers provide support between the first substrate and the second substrate.

Figure 1:
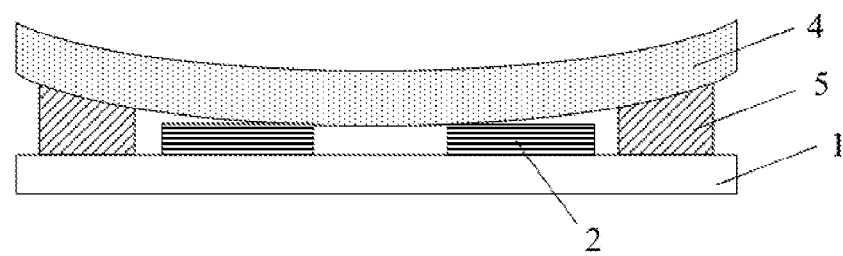
FIG. 1 is a schematic diagram of deformation of a display panel in an alignment process in the prior art.
Figure 2:
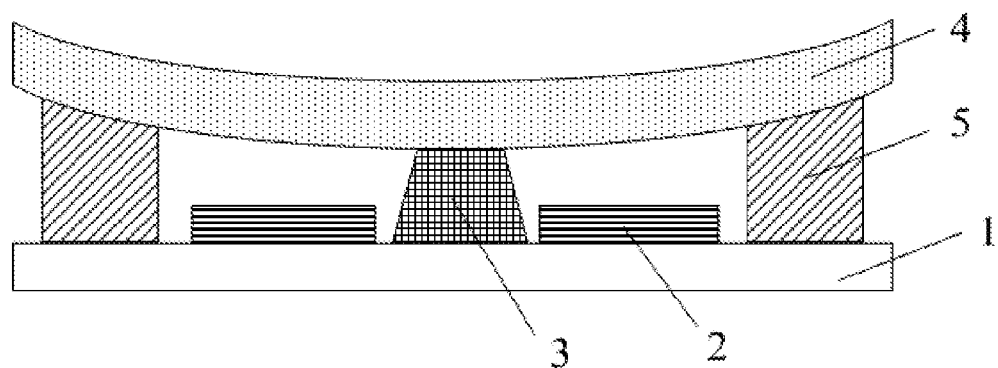
FIG. 2 is a structural schematic diagram of a display panel in the prior art.
Figure 3:
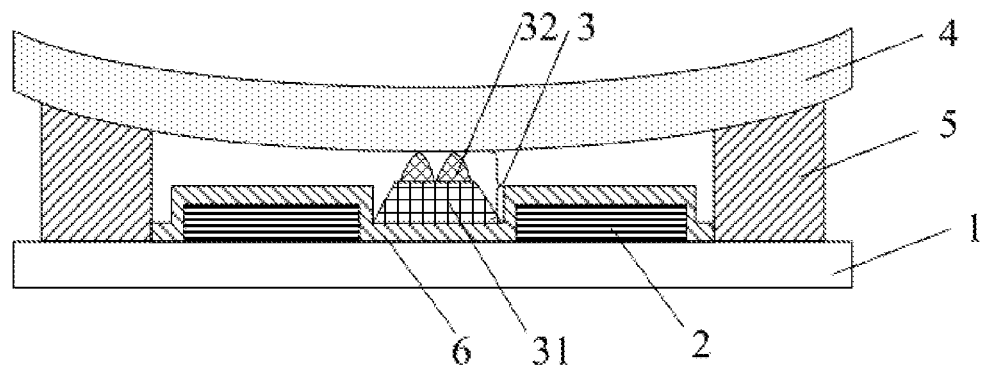
FIG. 3 is a structural schematic diagram of a display panel provided by Embodiment 1 of the present invention.

As shown in FIG. 3, in the structure of the display panel, the first substrate is the evaporated substrate 1, and the second substrate is the encapsulation substrate 4. The OLED devices 2 are provided on the evaporated substrate 1, and a photo spacer 3 is provided between the two adjacent OLED devices 2. The encapsulation substrate 4 is bonded to the evaporated substrate 1 by the frit seal 5 coated on the non-display area of the evaporated substrate 1 so as to form a full-sealing structure.

The photo spacer 3 includes a base 31 and protruding structures 32. The base 31 is made from indium tin oxide (ITO) or indium zinc oxide (IZO), the protruding structures 32 are grown on the top surface of the base 31 based on the base 31. Preferably, the base 31 is in a shape of circular truncated cone, and the protruding structures 32 are semi-spherical or semi-ellipsoidal. Ratio of thickness of the base 31 to thickness of each protruding structure 32 ranges from 1:2 to 1:3, and the thickness of the base is in the range of 1,000 Å to 4,000 Å.

As shown in FIG. 3, a protective layer 6 may be further provided on the OLED devices 2, and the protective layer 6 covers all OLED devices and extends to gap areas formed between the adjacent OLED devices. The photo spacers 3 are provided on the protective layer 6 and correspond to the gap areas. The protective layer 6 is made from silicon nitride (SiNx), and has the main function as follows: the protective layer 6 can form a blocking layer on the OLED devices 2 so as to prevent the OLED devices 2 from being damaged when forming the bases 31 of the photo spacers by depositing a ITO thin film. Moreover, the protective layer 6 can prevent water and oxygen from entering into the OLED devices 2, thus further prolonging the service life of the OLED devices 2. Thickness of the protective layer 6 may be in the range of 4,000 Å to 10,000 Å.

Correspondingly, the embodiment further provides a method for fabricating a display panel, including steps of:

S1: forming a plurality of sub-pixel units on a part of the first substrate corresponding to a display area of the first substrate; and S2: forming a photo spacer between two adjacent sub-pixel units, wherein step S2 includes steps of:

S21: forming bases 31 on the first substrate; and

S22: based on each base 31, growing a plurality of protruding structures 32 on a top surface of the base 31.

Preferably, prior to step S2, the manufacturing method provided by the present invention also includes a step of: forming a protective layer 6 on the sub-pixel units (i.e. the OLED devices shown in FIG. 3), the protective layer 6 covers all OLED devices and extends to gap areas formed between the adjacent sub-pixel units, The bases 31 are formed on the protective layer 6 and correspond to the gap areas. Preferably, the protective layer 6 may be formed using silicon nitride by means of deposition in deposition equipment. The protective layer 6 can form a blocking layer on the OLED devices 2 so as to prevent the OLED devices 2 from being damaged when forming the bases 31 of the photo spacers by depositing a ITO film; also, the protective layer 6 can prevent water and oxygen from entering into the OLED devices 2, thus further prolonging the service life of the OLED devices 2.

Specifically, step S21 includes steps of: forming the bases 31 using a material containing In+ ions which are replaceable with H+ ions by means of sputtering in a chamber of a first film-forming equipment. The material containing In+ ions which are replaceable with H+ ions may be indium tin oxide (ITO) or indium zinc oxide (IZO). In the embodiment, the material of the base 31 is preferably ITO. The base 31 may be in a shape of circular truncated cone. Of course, the shape of the base 31 is not limited to the circular truncated cone, and according to the structural requirement, the shape of the base 31 may be configured to be in various three-dimensional shapes of which the sections are rectangular, square and the like.

Here, the first film-forming equipment is a sputter. A mask needs to be used when the ITO thin film is deposited so as to ensure that the ITO thin film is sputtered and deposited in a designated gap area, for example, formed in a light-proof area corresponding to gate lines, data lines and the like in the gap areas.

Generally, the ITO thin film is $In_2O_3$ thin film doped with Sn, and Sn atoms in the ITO thin film generally exist in a form of SnO (bivalent) or $Sn_2O$ (tetravalent). Some scholars have analyzed the surface of the ITO thin film by utilizing secondary ion mass spectrometry (SIMS) and come to a conclusion that negative ions O− and positive ions In+ on the surface of the ITO thin film are main components thereof. The secondary ion mass spectrometry is an analysis technique for surface elements or compound components. For example, the surface of a solid is bombarded by using Ar+ ions of 1 kV, secondary ions sputtered from the surface are introduced into a mass spectrum analyzer and are subjected to mass separation to obtain elements or compound components of the solid surface.

Step S22 specifically includes steps of:

placing the first substrate with the bases 31 formed thereon in a chamber of a second film-forming equipment, wherein the second film-forming equipment may be a plasma enhanced chemical vapor deposition (PECVD) equipment; and introducing $H_2$ into the chamber of the second film-forming equipment; ionizing $H_2$; replacing In+ ions in the ITO film forming the bases 31 with H+ ions, so as to grow the plurality of protruding structures on the surface of the ITO film. This process is also called Haze phenomenon. In a general semiconductor manufacturing process, the Haze phenomenon is an undesirable phenomenon (that is, defect caused by a fuzzy film layer grown on a surface). However, in the embodiment, by utilizing the Haze phenomenon, massive protruding structures 32 whose thickness is greater than the thickness of the base 31 (ratio of the thickness of the base 31 to the thickness of each protruding structure 32 ranges from 1:2 to 1:3) can be formed on the top surface of the base 31 in a very short time (generally several minutes), so that the fabricating of the photo spacers is finished. Therefore, the yield is increased, and target material is saved.

Specifically, the Haze phenomenon in the embodiment means such a phenomenon that the first substrate on which the bases 31 formed by ITO (for example) are formed is placed into the chamber of the second film-forming equipment, $H_2$ is introduced into the chamber of the second film-forming equipment, and the protruding structures whose sizes, shapes and thicknesses are properly regulated are grown on the top surface of the ITO thin film by regulating volume flow rate (for example, 500-2,000 sccm) for introducing $H_2$ and time for introducing $H_2$ (for example, 10 s-200 s) and controlling the process parameters in the chamber of the second film-forming equipment such as pressure intensity (for example, 500-3,000 Pa) and temperature (for example, 150-400° C.). The reason why the Haze phenomenon occurs is that after $H_2$ is introduced into the chamber of the second film-forming equipment, $H_2$ is ionized into H+ ions under the above-mentioned process parameters, and because the activity of H+ ions is stronger than that of In+ ions in the ITO thin film, the In+ ions can be replaced from the ITO thin film, and thus the In+ ions are deposited on the surface of the ITO thin film so as to gradually form the protruding structures 32. The protruding structures 32 may be semispherical or semi-ellipsoidal. Generally speaking, if the volume flow rate for introducing $H_2$ is larger and the time for introducing $H_2$ is longer, the size of the protruding structures 32 is larger and the number of the protruding structures 32 is greater. Here, it can be understood that because the top surface of the ITO thin film has large reaction area, the protruding structures are mainly grown on the top surface of the ITO thin film, and the protruding structures grown on the top surface of the ITO thin film are bigger and the number of the protruding structures is more; however, a side surface of the ITO thin film has small reaction area, although protruding structures can be grown, the grown protruding structures are small and the number of the protruding structures is less.

In the embodiment, the encapsulation substrate 4 and the evaporated substrate 1 of the display panel may be encapsulated by using frit seal 5, and the photo spacers 3 only have the function of supporting the encapsulation substrate 4 and the evaporated substrate 1. Because the size of a gap between the encapsulation substrate 4 and the evaporated substrate 1 is not strictly limited, the thickness of the photo spacers 3 does not need to be strictly limited; theoretically, it is only required that the thickness of the photo spacers 3 is greater than that of the OLED devices 2. According to the thickness of the OLED devices 2, the deposition thickness of the ITO thin film forming the bases 31 may be in the range of 1,000 Å to 4,000 Å, as long as the total thickness of the ITO thin film and the protruding structures 32 is greater than the thickness of the OLED devices 2 (the thickness of the OLED devices is generally about 3,000 Å).

In the display panel of the embodiment, the photo spacers are manufactured by utilizing the Haze phenomenon generated by contacting the ITO thin film with ionized $H_2$ and provide support between the encapsulation substrate and the evaporated substrate which are encapsulated by frit seal so as to effectively protect the OLED devices from being damaged, and therefore, the performance of the display panel is better. Moreover, the photo spacers can be manufactured by only using a sputter and a plasma enhanced chemical vapor deposition equipment. Compared with the photo line for manufacturing photo spacers in the prior art, the equipment cost is greatly reduced and the occupied space is narrowed, the yield is higher, and the manufacturing cost is reduced in the present invention.

Embodiment 2

This embodiment provides a display device including the display panel in embodiment 1.

The display device may be any product or component with display function, such as electronic paper, an OLED panel, a mobile phone, a tablet computer, a television, a display, a notebook computer, a digital picture frame, a navigator or the like.

The display device adopts the display panel provided by embodiment 1, and thus has good display effect and reduced cost at the same time.

It should be understood that the above-mentioned embodiments are only exemplary embodiments for illustrating the principle of the present invention; however, the present invention is not limited thereto. Various variations and improvements can be made by a person skill in the art without departing from the spirit and essence of the present invention, and these variations and improvements should also be considered to be within the protection scope of the present invention.

The invention claimed is:

1. A display panel, comprising a first substrate, which is divided into a display area and a non-display area surrounding the display area, wherein a plurality of sub-pixel units are provided on a part of the first substrate corresponding to the display area, a photo spacer is provided between two adjacent sub-pixel units, the photo spacer comprises a base and a plurality of protruding structures grown on a top of the base, the base is made from a material including In+ ions which are replaceable with H+ ions, and both the base and the plurality of protruding structures are provided only between the two adjacent subpixel units.

2. The display panel according to claim 1, wherein each sub-pixel unit comprises an OLED device, and thickness of the photo spacer is greater than that of the OLED device.

3. The display panel according to claim 1, wherein the material including In+ ions which are replaceable with H+ ions is indium tin oxide or indium zinc oxide.

4. The display panel according to claim 1, wherein the base is in a shape of circular truncated cone, and the protruding structures are semispherical or semi-ellipsoidal.

5. The display panel according to claim 1, wherein ratio of thickness of the base to thickness of each protruding structure ranges from 1:2 to 1:3, and the thickness of the base is in the range of 1,000 Å to 4,000 Å.

6. The display panel according to claim 2, wherein a protective layer is provided on the OLED devices, the protective layer covers the OLED devices and extends to gap areas between adjacent OLED devices, and the photo spacers are provided on the protective layer and correspond to the gap areas.

7. The display panel according to claim 6, wherein material of the protective layer is silicon nitride.

8. The display panel according to claim 6, wherein thickness of the protective layer is in the range of 4,000 Å to 10,000 Å.

9. The display panel according to claim 1, wherein the display panel further comprises a second substrate, and an encapsulation frame corresponding to periphery of the non-display area is provided between the first substrate and the second substrate and is made from frit seal.

10. A display device, comprising the display panel according to claim 1.

11. A method for fabricating a display panel, comprising steps of:
   S1: forming a plurality of sub-pixel units on a part of a first substrate corresponding to a display area of the first substrate; and
   S2: forming a photo spacer between two adjacent sub-pixel units, wherein step S2 comprises steps of:
   S21: forming bases on the first substrate using a material including In+ ions which are replaceable with H+ ions; and
   S22: based on each base, growing a plurality of protruding structures on a top surface of the base.

12. The method for fabricating a display panel according to claim 11, wherein step S21 comprises a step of: forming the bases in a chamber of a first film-forming equipment by means of sputtering.

13. The method for fabricating a display panel according to claim 11, wherein the material including In+ ions which are replaceable with H+ ions is indium tin oxide or indium zinc oxide.

14. The method for fabricating a display panel according to claim 11, wherein step S22 comprises steps of:
   placing the first substrate with the bases formed thereon into a chamber of a second film-forming equipment; and
   introducing H2 into the chamber of the second film-forming equipment, ionizing H2, replacing, with H+ ions generated by the ionizing, In+ ions in the material forming the bases and including In+ ions which are replaceable with H+ ions so as to grow the plurality of protruding structures on the top surface of the base.

15. The method for fabricating a display panel according to claim 14, wherein volume flow rate for introducing $H_2$ is in the range of 500 sccm to 2,000 sccm, and time for introducing $H_2$ is in the range of 10 s to 200 s; pressure intensity in the chamber of the second film-forming equipment is in the range of 500 Pa to 3,000 Pa, and temperature therein is in the range of 150° C. to 400° C.

16. The method for fabricating a display panel according to claim 14, wherein the first film-forming equipment is a sputter, and the second film-forming equipment is a plasma enhanced chemical vapor deposition equipment.

17. The method for fabricating a display panel according to claim 11, wherein prior to step S2, the fabricating method further comprises a step of: forming a protective layer on the sub-pixel units, wherein the protective layer covers all sub-pixel units and extends to gap areas formed between adjacent sub-pixel units, and the bases are formed on the protective layer and correspond to the gap areas.

18. The method for fabricating a display panel according to claim 17, wherein the protective layer is formed using silicon nitride by means of deposition in a deposition equipment.

\* \* \* \* \*